United States Patent [19]
Dreifuss et al.

[11] Patent Number: 5,940,457
[45] Date of Patent: Aug. 17, 1999

[54] MILLIMETER-WAVE (MMW) SYNTHESIZER WITH FSK MODULATION TRANSMITTER

[75] Inventors: Yona Dreifuss, Haifa; Oded Maltz, Kiryat Motzkin, both of Israel

[73] Assignee: State of Israel-Ministry of Defense Armament Development Authority-Rafael, Haifa, Israel

[21] Appl. No.: 08/790,136

[22] Filed: Jan. 29, 1997

[30] Foreign Application Priority Data

Feb. 6, 1996 [IL] Israel ......................................... 117058

[51] Int. Cl.[6] ....................................................... H03D 3/24
[52] U.S. Cl. ............................... 375/376; 375/354; 331/4; 331/2
[58] Field of Search ................................. 331/25, 16, 1 A, 331/2, 17, 18, 23; 375/295, 354, 376; 332/127, 123

[56] References Cited

U.S. PATENT DOCUMENTS

| | | | |
|---|---|---|---|
| 4,249,138 | 2/1981 | Bell | 331/1 A |
| 4,707,670 | 11/1987 | Dakin | 332/127 |
| 4,755,774 | 7/1988 | Heck | 332/123 |
| 4,797,637 | 1/1989 | Kegasa et al. | 331/4 |
| 5,408,201 | 4/1995 | Uriya | 331/2 |

*Primary Examiner*—Stephen Chin
*Assistant Examiner*—Shuwang Liu
*Attorney, Agent, or Firm*—Mark M. Friedman

[57] ABSTRACT

A frequency-shift-keyed PLL frequency synthesizer with large frequency-multiplication factor, with absolute frequency deviation independent of frequency-multiplication factor. The PLL also has fractional frequency-multiplication-factor programming capability. The PLL is inexpensive to implement, and potentially capable of fast frequency changing, due to lack of need to compensate modulator frequency deviation with possible resulting stabilization-time requirements, associated with each PLL output-frequency change. The PLL frequency synthesizer preferably employs a PLL-DRO and subharmonic mixer to achieve stable, low-noise microwave output frequencies.

16 Claims, 5 Drawing Sheets

MILLIMETER-WAVE (MMW) SYNTHESIZER WITH FSK MODULATION TRANSMITTER

FIELD AND BACKGROUND OF THE INVENTION

The present invention relates to a Radio Transmitter incorporating a Milli-Meter Wave Synthesizer with Frequency-Shift-Keyed (FSK) Modulation and, more particularly, to a FSK Modulated Frequency Synthesizer employing a novel phase-locked loop (PLL) requiring simpler modulation circuitry than that required with prior art FSK PLL Frequency Synthesizers.

The improved FSK PLL Frequency Synthesizer of the present invention incorporates a novel PLL configuration which provides output frequency deviation substantially independent of the frequency synthesizer multiplication factor. This constant frequency deviation versus frequency multiplication factor is due to the new PLL mixing scheme used for frequency multiplication.

In most prior art synthesizers, the input frequency source serves not only as the reference frequency source for the synthesizer, but is also the means for providing frequency modulation of the output frequency. In a prior art PLL, if the output frequency is changed, then the maximum frequency deviation also changes. Thus, in prior art PLL's, if a frequency multiplication of "K" times the reference oscillator frequency would be required, then with a maximum fm frequency deviation of $df_{max}$, at a nominal output frequency $fo_{nom}$, the resulting actual frequency deviation will be $$df_{act} = K * df_{max} = (fo_{act}/fo_{nom}) * df_{max}. \qquad (1)$$

In contrast, in the present invention, the frequency multiplication is accomplished by a PLL incorporating a novel mixing scheme in which the maximum frequency deviation is substantially independent of the PLL frequency synthesizer frequency multiplication ratio.

Prior art phase-locked loops multiply frequency and maximum frequency deviation proportionately. In the prior art, the frequency multiplication by a given frequency multiplication factor, therefore, has a corresponding proportional frequency deviation multiplication factor. Thus, for a frequency-shift-keyed (FSK) transmitter, or for a general frequency-modulated (FM) transmitter, each time a frequency change would be required in the transmitter output frequency, the modulation source maximum frequency deviation would also require adjustment, making the modulation source maximum frequency deviation inversely proportional to the transmitter frequency. This necessarily would result in a great complication of the modulator circuitry, with corresponding transmitter cost increase. For the case of a frequency-shift-keyed transmission system, this is especially important, since very narrow bandwidth receiving band-pass filters would normally be used to filter the FSK modulation, for best interfering-signal rejection. Further, in the case of a frequency-hopping anti-jamming frequency system, the speed at which the transmission frequency could be changed may potentially be reduced, due to the potential necessity of additional time for the modulator maximum frequency deviation circuitry to stabilize after each adjustment, depending on the exact method of implementing the circuitry.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a PLL FSK frequency synthesizer which can be used beneficially to provide an inexpensive millimeter-wave frequency output for millimeter-wave FSK transmission. The present invention is not only inexpensive to implement, but has the further advantage of constant absolute output FSK modulation frequency-deviation as a function of transmitter output frequency. This feature is especially useful for the case of fast-frequency changing, frequency-hopping, anti-jamming transmission systems.

The principles and operation of a PLL FSK Frequency Synthesizer according to the present invention may be better understood with reference to the drawings and the accompanying description.

Figure 1:
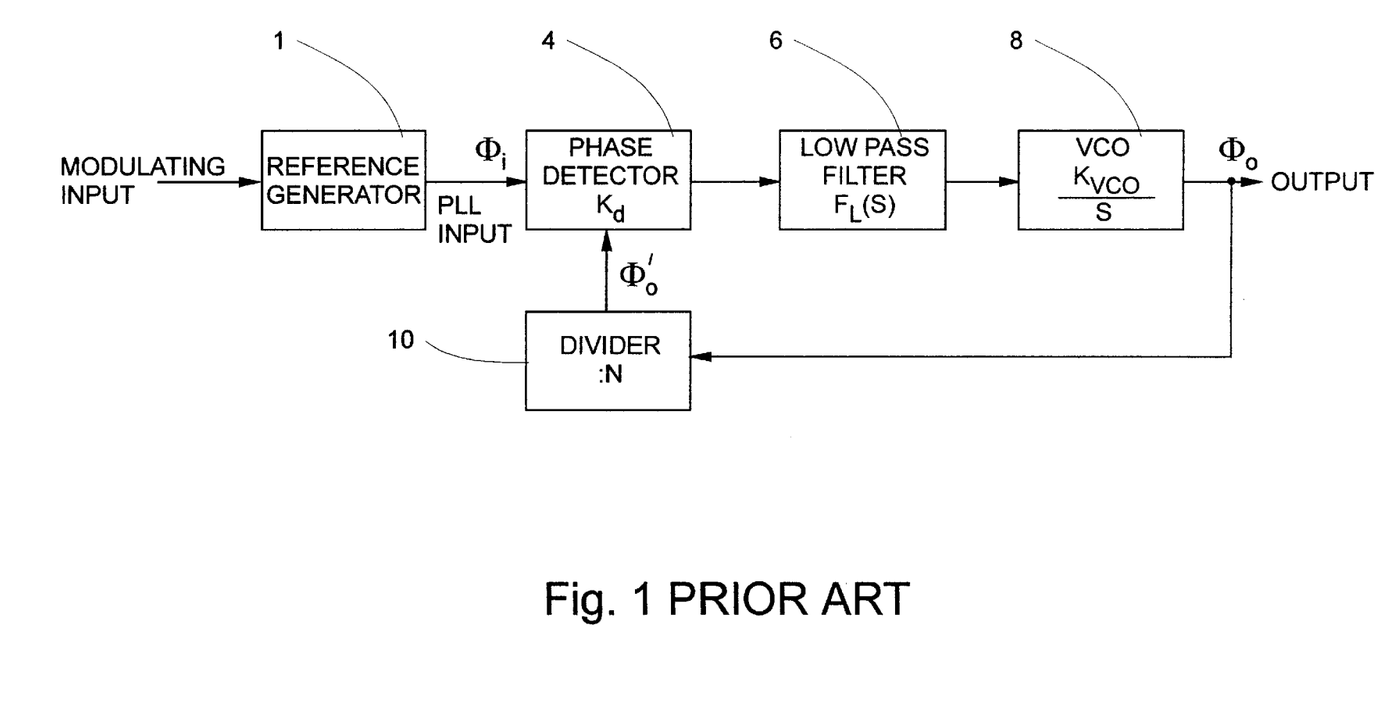
FIG. 1 is a prior art PLL frequency synthesizer.

Referring now to the drawings, FIG. 1 illustrates the prior art implementation of a FSK PLL frequency synthesizer. In the prior art PLL FSK frequency synthesizer, the reference generator, 1, is an oscillator which accepts a modulation control input, and provides a FSK-modulated output. FSK is just a special case of Frequency-modulation, in which the output frequency takes on two discrete values. The generator may be a voltage-controlled oscillator, and the modulation input may be a control-voltage input. The modulation voltage would take on either of two values corresponding to two output frequency states, and may be controlled by digital logic changing the two output states. In the case of FM, in general, the modulation voltage would be analog, not two-valued.

The two output frequency values are required to have fixed frequency differences from the nominal generator output frequency. The PLL multiplies the input frequency by a factor of N, corresponding to the feedback reference signal frequency division ratio. The fixed frequency differences are multiplied by the same ratio. For example, assume that the two frequency differences are 850 Hz and 1300 Hz, and the nominal input carrier frequency is 1 MHz. The two FSK frequencies are 1.000850 MHz and 1.001300 MHz. These are the two actual frequencies appearing at the input to the PLL. If N=10, then the two output frequencies are 10.008500 MHz and 10.013000 Mhz. As the change of the frequency deviation from the original one is multiplied ten times in a receiver, the resulting output tones are 8500 Hz and 13000 Hz, ten times the original FSK input tone frequencies. To obtain the original frequency deviation after demodulation, the division of the frequency deviation of the modulation tone frequencies at the reference generator output is required by a factor of N, 10 in the example case given.

The PLL operation is well-known. Phase detector, 4, detects the phase difference between two input frequencies $\phi_i$ and $\phi'_o$. The phase difference is usually in the form of $v_e = \cos(\phi_i - \phi'_o)t$, where $v_e$ is an error output signal. This is a "beat frequency" for ($\phi_i-\phi'_o$) not equal to zero. The beat frequency error signal output, $v_e$, is low-pass-filtered in low-pass-filter block, 6, providing the control voltage input to voltage-controlled-oscillator, VCO, 8. The VCO output is the phase-locked loop frequency synthesizer output signal. The frequency of the signal is divided by a factor, N, by a divide-by-N frequency divider, N-divider, 10. Frequency divider, 10, is often realized as a digital counter. For a frequency-multiplication factor of the PLL of ten, the divider would provide a frequency division of ten. The divider output frequency, $\phi'_o$, would be forced by feedback, to track the PLL input frequency, $\phi_i$. This would be accomplished by the control voltage input to the VCO forcing the VCO output to be ten times the reference generator output frequency.

As previously discussed, the use of such a PLL in a fast frequency-hopping anti-jamming communication system or radar or similar, would be complicated by the need for adjusting the reference generator output frequency deviation to correspond to each new value of N used in the synthesizer feedback loop, in order to maintain constant PLL output-frequency deviation. This would be a hardware expense, and a probable speed limitation on the rate of frequency hopping.

Figure 2A:
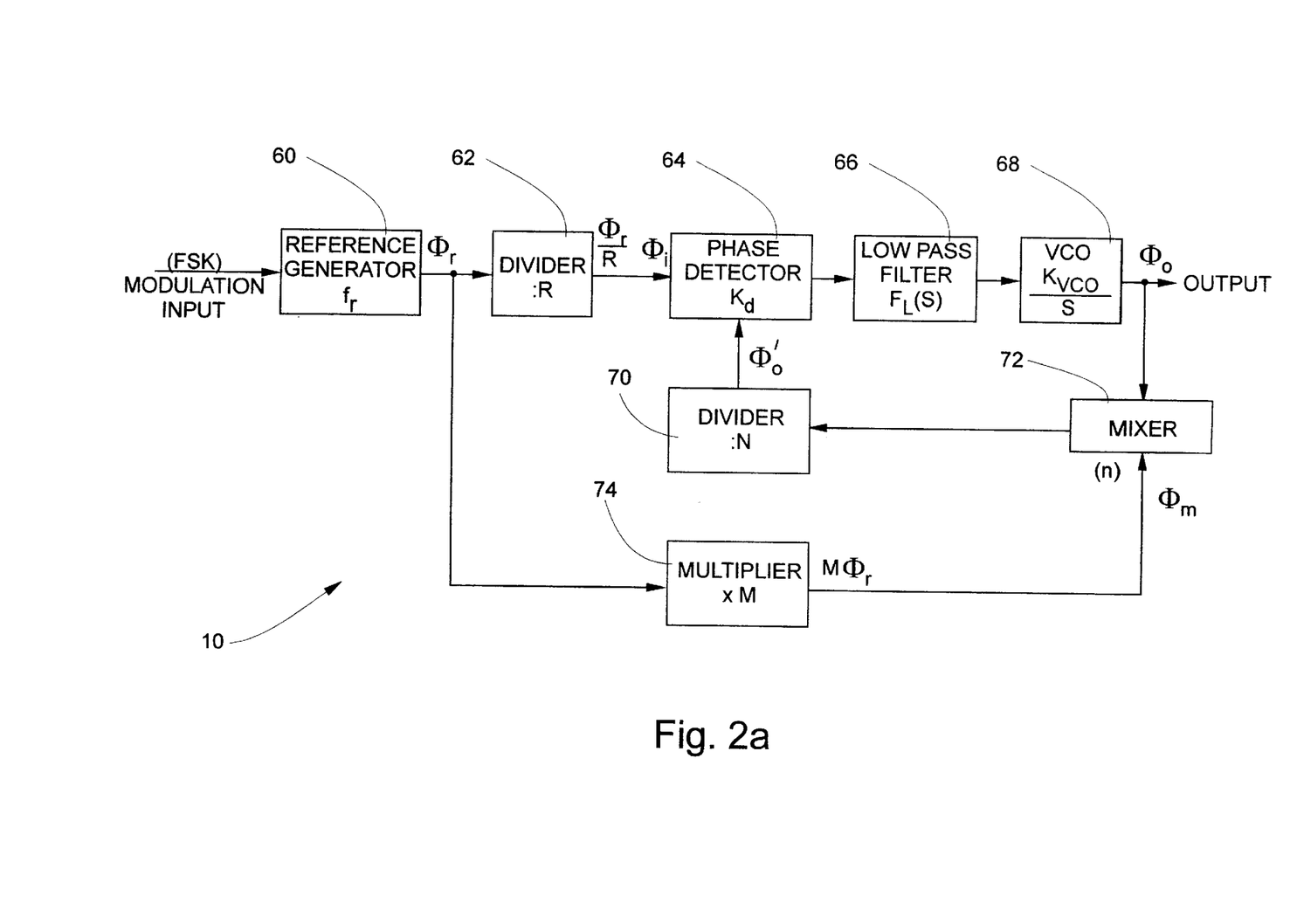
FIG. 2A is a simplified block diagram of a PLL FSK frequency synthesizer according to the present invention.

The PLL of the present invention is shown in FIG. 2A. Here blocks 64, 66, 68, and 70, have corresponding functions to blocks 4, 6, 8, and 10, in FIG. 1. The differences from the prior art result in improved performance, as will be described. Divide-by-R frequency divider, R-divider, 62, and multiply-by-M frequency multiplier, M-multiplier, 74, have been added, as well as mixer, 72. The mixer, 72, operates in the same way as the phase detectors, 4 and 64, providing a "beat-frequency", difference-frequency, output depending on their input frequencies. This is the case of a simple mixer.

Alternatively, mixer 72 may be a "subharmonic mixer", or harmonic mixer, or any combination of a frequency multiplier and a mixer. A "subharmonic mixer" of subharmonic, n, mixes, i.e., multiplies, n times one input frequency, with one times a second input frequency. If mixer 72, and frequency divider, 62, and frequency multiplier, 74, were absent, then FIG. 2A would be the same as FIG. 1. In a preferred embodiment, mixer 72 is a subharmonic mixer, mixing n times input frequency $\phi_m$ with output frequency $\phi_o$. This may be realized by a passive mixer.

A simple mixer may be considered to be a special degenerate case of a subharmonic mixer, in which n=1. Therefore, for the purpose of the claims, a mixer is to be understood to be a "generalized" mixer of subharmonic n, where n may be multiplier, 1, . . . , n. This generalized mixer, then, includes "simple" mixers (n equal to 1) and "subharmonic" mixers (n not equal to 1). The generalized mixer will be referred to as an "n-mixer". The generalized n-mixer definition also includes any combination of a multiply-by-n (n-times or xn) frequency multiplier with an ordinary mixer.

The novel PLL of FIG. 2A can be analyzed to derive its transfer function, as follows:

$$\phi_o=[(\phi_i-\phi'_o)K_d]F_L(s)(K_{VCO}/s) \quad (1)$$

$$\Phi'_o=(\phi_o-n\phi_m)/N \quad (2)$$

$$\phi_i=\phi_r/R \quad (3)$$

$$\phi_m=M\phi_r \quad (4)$$

Inserting (2) into (1), $$\phi_o=(N\phi_i-\phi_o+n\phi_m)K_dF_L(s)K_{VCO}/(N\ s) \quad (5)$$

and simplifying, $$H'(s) = \frac{[K_d F_L(s) K_{vco}/(Ns)]}{1 + [K_d F_L(s) K_{vco}/(Ns)]} \quad (6)$$

$$\phi_0 = (N\phi_i + n\phi_m)H'(s) \quad (7)$$

Substituting (3) and (4) into (7), $$\phi_o=\phi_r[nM+N/R]H'(s) \quad (8)$$

$$\phi_o/\phi_r=[nM+N/R]H'(s) \quad (9)$$

This gives the small-signal transfer function for frequency modulation, in general. Examination of equation (9) shows that the overall frequency-multiplication factor of the PLL of the present invention is by the factor [nM+N/R]. The prior-art PLL had a frequency-multiplication factor of N, corresponding to the division ratio of frequency divider, 10.

A first advantage of the PLL of the present invention over the prior art PLL is the ability to program the overall PLL output frequency to be a fractional ratio times the input frequency. This provides flexibility in frequency-multiplication for small frequency multiplication ratios, or for fine incremental output-frequency steps at large frequency-multiplication ratios with fractional multiplication ratios, due to R-divider, 62, and N-divider, 70.

In the preferred embodiment of the present invention, a phase-locked dielectric-resonant-oscillator (PLL-DRO) is used for M-multiplier, 74. A PLL-DRO is a low-phase-noise dielectric-resonator-oscillator, the output frequency of which tracks the frequency of an external input reference frequency generator. Using a crystal-controlled oscillator as the reference signal generator, maintains the excellent frequency stability of the crystal oscillator and low phase noise characteristics of the crystal oscillator/DRO combination. The PLL-DRO functions, in the present invention, as a relatively low-noise, high-stability, frequency multiplier. Alternatively, a PLL-VCO, a phase-locked voltage-controlled-oscillator may be used, where its lower frequency stability is adequate. Both PLL-DRO and PLL-VCO are well-known components which may be purchased from many manufacturers.

The system of FIG. 2A does not yet, however, provide the desired feature of frequency multiplication with output frequency deviation independent of frequency-multiplication factor.

Figure 2B:
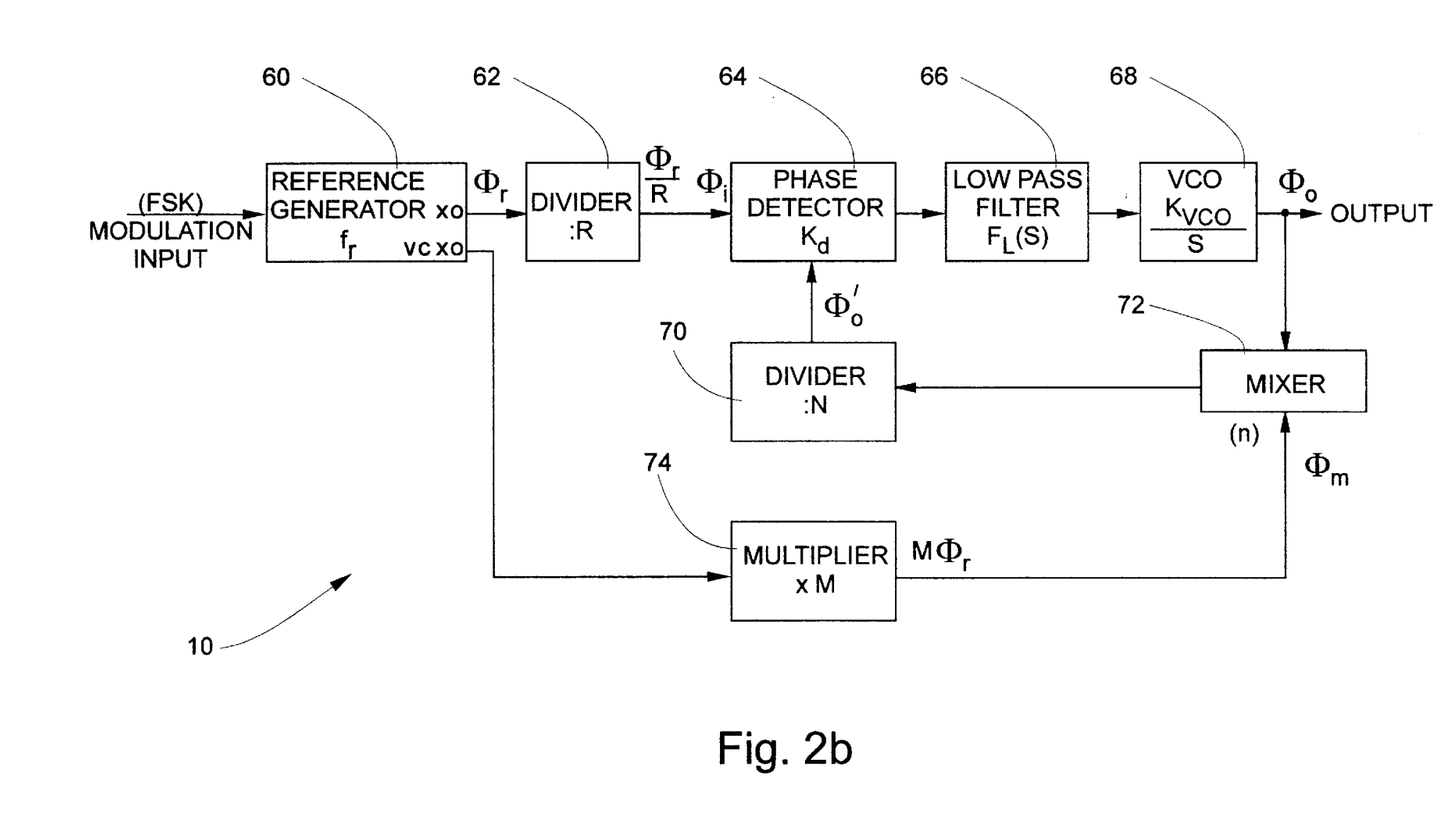
FIG. 2B is an exact block diagram of a preferred embodiment of a PLL FSK frequency synthesizer according to the present invention.
Figure 3:
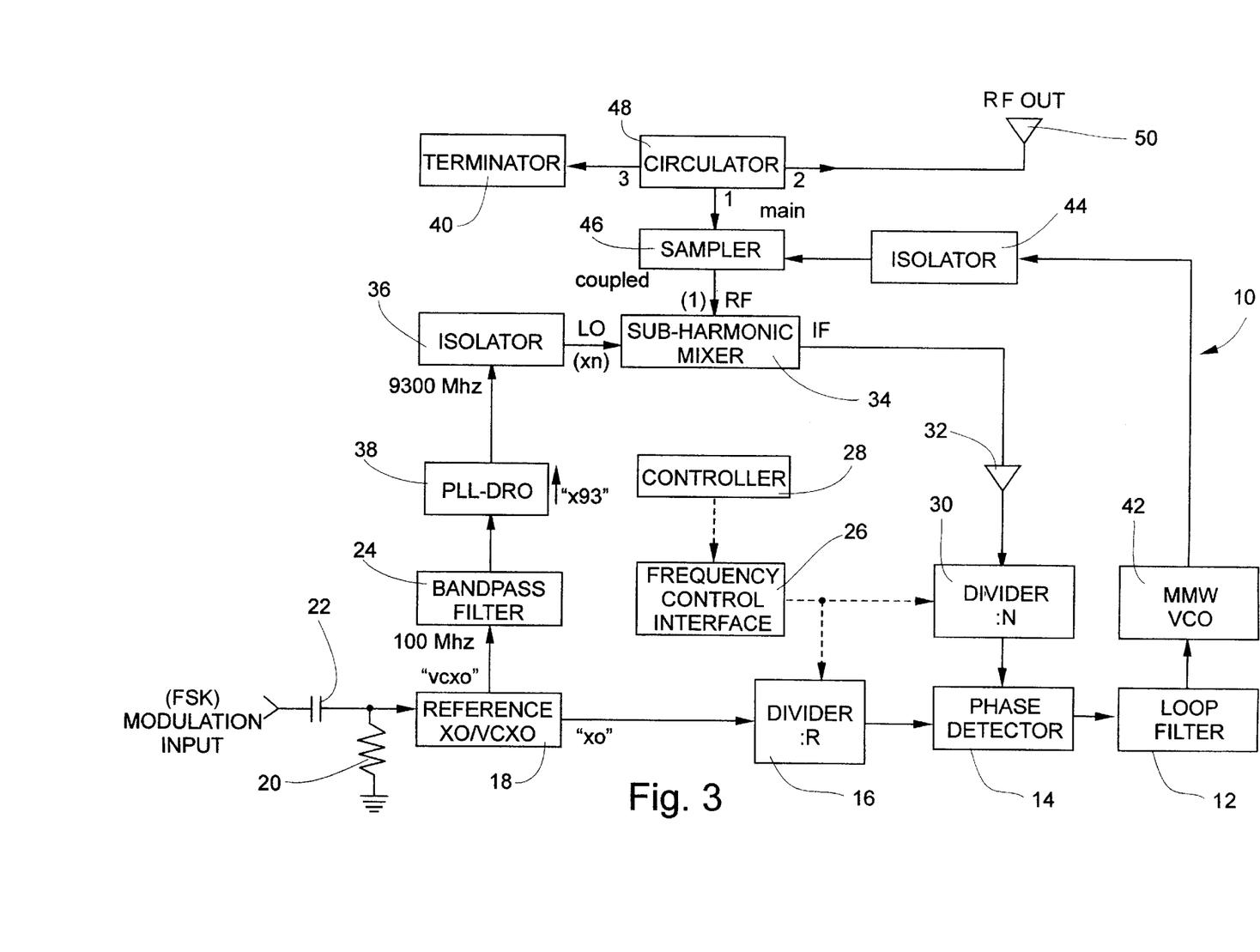
FIG. 3 is a detailed block diagram of a preferred embodiment of a PLL FSK frequency synthesizer according to the present invention.

In order to obtain the frequency-multiplication-factor independent FSK modulation frequency deviation, it is necessary to employ a novel reference frequency generator as the reference generator block of Figures 2B and 3. The use of the novel reference generator block, in the PLL of FIG. 2B, makes possible the substantially output-frequency-independent FSK modulation.

Figure 4:
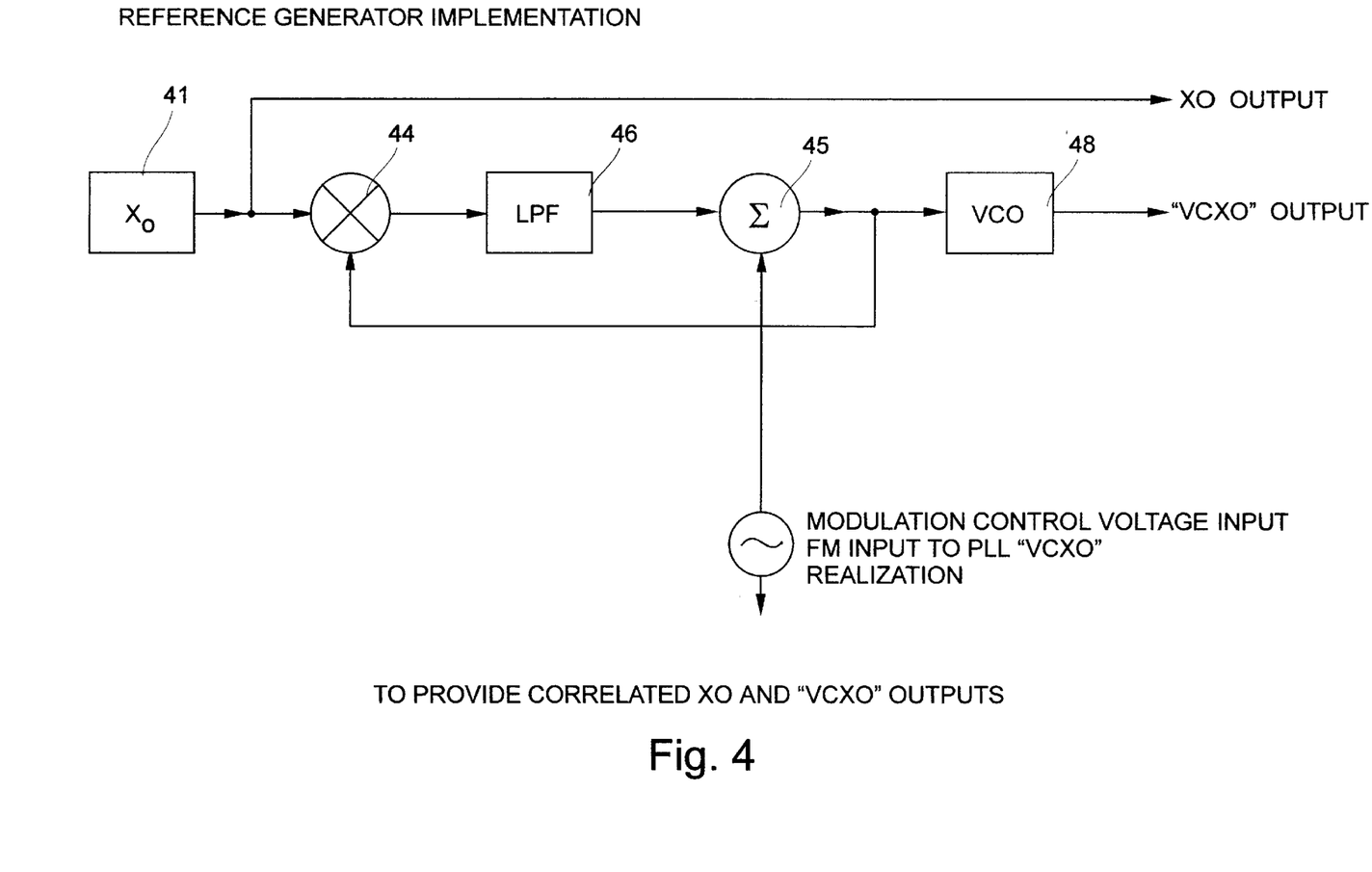
FIG. 4 is a detailed block diagram of a preferred embodiment of a reference generator according to the present invention.

Referring now to FIG. 4, a novel reference generator as required by the present invention, has two correlated outputs at the same frequency. One output is a "crystal-oscillator", "xo", output, which is the un-modulated reference output frequency. The second output is a frequency-modulated/FSK-modulated output. The second, modulated, output is correlated to the first, carrier, output, since it is derived from it. In the scheme of FIG. 4 for accomplishing this result, the output of "crystal-oscillator", "xo", 41, is also fed to a PLL, which provides a "voltage-controlled-crystal-oscillator", "vcxo" output. This second output is modulated by the modulation control-voltage input to the reference generator. As shown, this may be accomplished by summing the input modulation voltage with the LPF-output voltage which forces the vcxo output to track the xo carrier frequency. With the addition of the modulation voltage to the LPF output voltage, the vcxo output frequency will be forced to be offset from the xo output frequency. But the two oscillator outputs are correlated, since the vcxo nominal carrier frequency is equal to the xo carrier output frequency. Thus, the vcxo nominal carrier output frequency will track any drift in the xo output carrier frequency. The PLL consists of blocks 44, 46, 48, with functionality identical to that of blocks 4, 6, 8, of FIG. 1, respectively. Added block, 45, is a summer, a summing amplifier, for adding in the modulation control input voltage with the LPF output voltage, thereby modulating the vco output frequency. The vco, and hence vcxo, output frequency would have otherwise tracked and equalled the xo output frequency, but now is offset from the xo output frequency, depending on the addition "error" voltage from the modulation input voltage which is added in by the summer, block 45. "Crystal oscillator", "xo", 41, may also be realized as a non-crystal-stabilized oscillator, where the frequency stability of a crystal oscillator is not required. Other implementations of a reference generator providing two correlated outputs, one modulated, and one not modulated, which may be provided by the skilled artisan, and are considered to be within the scope of the novel reference generator function included in the present invention.

Referring now to FIG. 2B, we add in the novel reference generator of FIG. 4, to the PLL of FIG. 2A. This reference generator is now referenced by reference number 600.

There are two alternatives for the connection of the two reference generator outputs:

(1) In the regular case, as shown in FIG. 2B, the vcxo output is connected to the m-multiplier, 74, input. Now, the modulated vcxo reference generator output will be multiplied by the factor nM of equation (9) above. Since the vcxo output is modulated, the contribution of the "nM" path error signal, which, ultimately, due to feedback, appears at the control voltage output of LPF, 66, i.e., at the input of vco, 68, contains modulation as well as carrier frequency information. Thus the nM frequency-multiplication term in the frequency-multiplication factor effects the FSK modulation frequency deviation. However, in a preferred embodiment, the product nM will be held constant, and only the values of N and R will be adjusted to effect frequency hopping as will be discussed. The reference generator output frequency deviation will have to be compensated in the original design to accommodate the subsequent multiplication by the factor nM, but will not require subsequent adjustment with output frequency changes, as would have been required with prior-art PLL's.

In this regular, first case, the "xo" output of reference generator, 600, will go through a frequency-multiplication mechanism in the "N/R" path very much like the frequency-multiplication of the prior-art PLL of FIG. 1. If the xo output of reference generator, 600, were modulated, then the same proportional increase of modulation frequency deviation would take place for the xo output of the reference generator, and the situation would be identical to that of FIG. 1. But since the xo output of reference generator, 600, is unmodulated, the proportional multiplication of modulation with frequency-multiplication factor which is present in the N/R path is non-existent. Thus, the N/R path may be employed as the programming means for frequency hopping control of the output frequency of the novel PLL frequency synthesizer of the present invention, without affecting the output frequency deviation with changes in PLL output frequency.

While the PLL of FIG. 2B is more complex than that of FIG. 1, the advantage of not needing a reference generator with programmable frequency deviation, inversely proportional to frequency-multiplication factor represents a complexity reduction, and a probable output-frequency rate of change improvement over the prior art.

Referring to FIG. 2B, the two frequency-multiplication "paths" can be represented by re-writing equation (8) as follows:

$$\phi_o = [nM\phi_r|_{vcxo} + (N/R)\phi_r|_{xo}]H'(s) \qquad (8.2),$$

showing that connection of the vcxo output of the reference generator necessitates compensation of frequency deviation by the factor nM, and with the understanding that the xo output of reference generator is unmodulated, showing that the term N/R may be varied without affecting $\phi_o$ as $\phi_o$ is varied by changing N/R.

(2) In the less common, second case, the vcxo and xo output connections of reference generator, 600, are reversed. In this case, the un-modulated xo output is connected to the M-multiplier, 74, input. Now, the un-modulated xo reference generator output will be multiplied by the factor nM of equation (9) above. Since the xo output is unmodulated, the contribution of the "nM" path error signal, which, ultimately, due to feedback, appears at the control voltage output of LPF, 66, i.e., at the input of vco, 68, contains only carrier frequency information. Thus the nM frequency-multiplication term in the frequency-multiplication factor has no effect on the FSK modulation frequency deviation.

In this second case, the "vcxo" output of reference generator, 600, will go through a frequency-multiplication mechanism in the "N/R" path very much like the frequency-multiplication of the prior-art PLL of FIG. 1. The same proportional increase of modulation frequency deviation would take place for the vcxo output of the reference generator, if the nM path error signal were not present at the vco, 68, input, and the situation would be identical to that of FIG. 1. If nM>>N/R, then the effect of the proportional multiplication of modulation with frequency-multiplication factor which is present in the N/R path is reduced. If the term nM is ten times N/R, then the increase in FSK modulation frequency deviation will be approximately one-tenth of that in the prior-art PLL of FIG. 1. While the PLL of FIG. 2B is more complex than that of FIG. 1, the advantage of not needing a reference generator with programmable frequency deviation, inversely proportional to frequency-multiplication factor represents a complexity reduction, and a probable output-frequency rate of chance improvement over the prior art.

In this second case, reversing the reference generator output connections from those shown in FIG. 2B, the two frequency-multiplication "paths" can be represented by re-writing equation (8) as follows:

$$\phi_o = [nM\,\phi_r|_{xo} + (N/R)\phi_r|_{vcxo}]H'(s) \qquad (8.5)$$

The condition for output modulation frequency deviation substantially independent of frequency multiplication factor is $$(nM) >> (N/R) \qquad (10).$$

Continuing our previous example, choose N=1, R=1, n=4, M=25. Then nM=100, N/R=1, and the output frequency is multiplied by 101, with modulation frequency deviation increase of about one-percent.

For another example, if n=4, M=360, $f_{carrier}$=10 MHz, N=10, R=10, then the frequency multiplication factor is [nM+N/R]=[1440+1]=1441, so the output frequency is 1.441 GHz, and the percentage increase in frequency deviation is 1/1441, which is about one-tenth of one percent! So 850 Hz and 1300 Hz would increase to about 850.85 Hz and 1301.3 Hz! That sounds practical.

If N/R is not equal to one, then the output frequency deviation will be different from the input frequency deviation. For example, for N/R=10, an input frequency deviation of 85 Hz would result in an output frequency deviation of about 850 Hz. Thus, the fractional-multiplication-factor feature is primarily useful for unmodulated synthesizers, for small frequency-multiplication factors. The fractional-multiplication-factor feature is also useful for small percentage changes of output frequency, which result in approximately correspondingly-small percentages of residual FM or frequency-deviation change with output frequency change. This will be illustrated below. This second case is useful for applications where it is necessary to provide interchangeability of reference generators in systems with many nM path multiplication factors, making impossible the initial compensation of the reference generator output frequency deviation by a factor nM. The performance of the system of the second case is adequate for many applications, representing a hardware savings over that which would be required with prior art PLL's, even if the "second case" behaviour is still not one-hundred percent ideal.

The application of the "first case" PLL of the present invention in a millimeter-wavelength synthesized FSK-modulated transmitter is shown in FIG. 3. Reference generator block, 18, has "vcxo" and "xo" outputs to bandpass filter (BPF), 24, and R-divider, 16, respectively. The output of BPF, 24, is the input to PLL-DRO, 38, which includes a 9300 MHz DRO oscillator, which tracks its input frequency by PLL operation, and is used as the M-multiplier. The output of PLL-DRO, 38, is fed to isolator, 36, to stabilize the load impedance at the output of the PLL-DRO, and also to establish the impedance presented to the input of subharmonic mixer, 34. Any device providing the isolation function, such as a simple attenuator (pad), may also be used as isolator, 36. Subharmonic mixer, 34, "multiplies" the isolated output from PLL-DRO, 38, by a factor of n, where n=4 in our example embodiment, and multiplies this with its other input, providing an output error signal. The subharmonic mixer, 34, output error signal is amplified by amplifier, 32, and fed to N-divider, 30. The output of N-divider, 30, serves as one input to phase detector, 14, the second input of which is the output of R-divider, 16. The output of phase-detector, 14, is filtered in loop filter, 12, a low-pass-filter, as in the corresponding functional blocks of FIGS. 1, 2A, and 2B, described above. The output of loop filter, 12, provides the control input signal to millimeter-wavelength voltage-controlled-oscillator (MMW VCO), 42, the output of which is buffered by isolator, 44, the output of which provides the input to sampler, 46. MMW VCO, 42, is a power oscillator, providing an output power of about 26 dBm, in the preferred embodiment, at $K_a$-band, about 37.2 GHz. This is a relatively high power at a stable output frequency, with FSK modulation, an unusual accomplishment. Circulator, 48, receives input from sampler, 46, to provide its rf output to antenna, 50. Circulator, 48, has a third port, terminated with termination, 40, thereby providing isolation from received signals at the antenna being fed into the transmitter output. This enhances transmitter stability, when it is operating in an environment with other strong signals at frequencies near the transmitter output frequency. This is especially necessary, since the feedback path to the phase detector, 14, has no selectivity, is a broadband signal path.

In this example implementation, the reference generator, 18, outputs are at a nominal center frequency of 100 MHz, the combination of PLL-DRO, 38, and subharmonic mixer, 34, provide a multiplication factor of nM=372. This results in the 37.2 GHz nominal output frequency. Additionally, a controller, 28, such as a computer or a microprocessor, controls the values of N and R, to control the output frequency for frequency-hopping. A practical frequency-hopping range is over about 2 GHz at 37.2 GHz. Thus, the maximum frequency deviation change of the FSK modulation will be about five per cent. So for a "second case" system, with the vcxo and xo reference generator outputs interchanged, the FSK filters for the received FSK modulation must have a bandwidth greater than five per cent of the nominal FSK tone frequency in order to accommodate this demodulated received tone frequency deviation variation versus transmitter output frequency. This is still practical, and represents a savings over the difficulty of providing such performance in a prior art FSK frequency-hopping transmitter at these frequencies. The values of N and R are preferably programmable, adjustable, by computer, hardware, logic, control. The values of n and M are usually fixed by hardware design requirements to be constant, but in some implementations may also be made computer programmable, adjustable at the time of system operation. This provision of programmability of at least one of n, M, N, and R, is necessary to realize the real-time, rapid, frequency adjustment which constitutes frequency-hopping operation.

While the invention has been described with respect to a limited number of embodiments, it will be appreciated that many variations, modifications and other applications of the invention may be made. As with the "n-mixer" definition, above, degenerate, "trivial", cases of R-divider with R=1, and N-divider with N=1, M-multiplier with M=1, are to be considered to be within the scope of the present invention, including the case of the omission of the divider or multiplier constituting the method of realization of the division or multiplication by a factor of 1.

What is claimed is:

1. A phase-locked-loop frequency synthesizer, comprising:
   (a) a reference generator, providing a frequency output, at frequency $\Phi_r$;
   (b) a divide-by-R frequency divider, for dividing said reference frequency, $\Phi_r$, by a factor, R, thereby providing output frequency, $\Phi_r/R$;
   (c) a multiply-by-M frequency multiplier, said multiplier comprising a phase-locked-dielectric-resonant-oscillator (PLL-DRO), for multiplying said reference frequency, $\Phi_r$, by a factor, M, thereby providing output frequency, $\Phi_M$;
   (d) an n-subharmonic mixer, for mixing the phase-locked-loop output frequency, $\Phi_O$, and said multiplier output frequency, $\Phi_M$, thereby providing a mixer output frequency;
   (e) a divide-by-N frequency divider, for dividing said mixer output frequency by a factor, N, thereby providing output frequency, $\Phi'_o$;
   (f) a phase detector, with phase-detection slope $K_d$,
      having a first input, $\Phi_i$, for accepting input $\Phi_r/R$ from said divide-by-R divider output, and
      having a second input, $\Phi'_o$, for accepting input from said divide-by-N frequency divider, and
      providing a phase-detector output phase-error signal output depending on the phase difference between $\Phi_i$ and $\Phi'_o$,
      said output phase error signal equal to the product $K_d$ times $(\Phi_i - \Phi'_o)$;
   (g) a low-pass-filter, with transfer function $F_L(s)$, for accepting said phase-error signal from said phase-detector output, as input to said low-pass-filter, and for providing a low-pass-filtered phase-error signal output;

(h) a voltage-controlled oscillator, having transfer function $K_{VCO}/s$, having a control-voltage input, for accepting said low-pass-filtered phase-error signal output, and having an output for providing the phase-locked-loop output, with output frequency, $\Phi_O$; and a band-pass filter connected between said reference generator and said PLL-DRO, and an isolator connected between the output of said PLL-DRO and the multiplier-output-frequency input of said mixer.

2. A phase-locked-loop with frequency-deviation of the output-frequency, $\Phi_O$, of the phase-locked-loop output, independent of the frequency-multiplication factor of the phase-locked loop, the phase-locked-loop comprising:

(a) a reference generator,
  (1) having a modulation input for accepting input modulation; and,
  (2) having an unmodulated carrier frequency "xo" output, at frequency $\Phi_r$;
  (3) having modulated frequency "vcxo" output, also with nominal carrier frequency $\Phi_r$, said modulated frequency output correlated to said unmodulated carrier frequency output;

(b) a divide-by-R frequency divider, for dividing said reference frequency, $\Phi_r$, by a factor, R, thereby providing output frequency, $\Phi_r/R$;

(c) a multiply-by-M frequency multiplier, for multiplying said reference frequency, $\Phi_r$, by a factor, M, thereby providing output frequency, $\Phi_M$;

(d) an n-mixer, for mixing the phase-locked-loop output frequency, $\Phi_O$, and said multiplier output frequency, $\Phi_M$, thereby providing a mixer output frequency;

(e) a divide-by-N frequency divider, for dividing said mixer output frequency by a factor, N, thereby providing output frequency, $\Phi'_o$;

(f) a phase detector, with phase-detection slope $K_d$, having a first input, $\Phi_i$, for accepting input $\Phi_r/R$ from said divide-by-R divider output, and having a second input, $\Phi'_o$, for accepting input from said divide-by-N frequency divider, and providing a phase-detector output phase-error signal output depending on the phase difference between $\Phi_i$ and $\Phi'_o$, said output phase error signal equal to the product $K_d$ times $(\Phi_i - \Phi'_o)$;

(g) a low-pass-filter, with transfer function $F_L(s)$, for accepting said phase-error signal from said phase-detector output, as input to said low-pass-filter, and for providing a low-pass-filtered phase-error signal output;

(h) a voltage-controlled oscillator, having transfer function $K_{VCO}/s$, having a control-voltage input, for accepting said low-pass-filtered phase-error signal output, and having an output for providing the phase-locked-loop output, with output frequency, $\Phi_O$.

3. The phase-locked-loop as in claim 2, wherein (a) said unmodulated carrier frequency "xo" output, at frequency $\Phi_r$ serves as the input to said multiply-by-M frequency multiplier; and, (b) said modulated frequency "vcxo" output, also with nominal carrier frequency $\Phi_r$, serves as the input to said divide-by-R frequency divider.

4. The phase-locked-loop as in claim 2, wherein (a) said unmodulated carrier frequency "xo" output, at frequency $\Phi_r$ serves as the input to said divide-by-R frequency divider; and, (b) said modulated frequency "vcxo" output, also with nominal carrier frequency $\Phi_r$, serves as the input to said multiply-by-M frequency multiplier.

5. The phase-locked-loop as in claim 2, wherein said multiplier comprises a phase-locked-dielectric-resonant-oscillator (PLL-DRO).

6. The phase-locked-loop as in claim 5, further comprising a band-pass filter connect between said reference generator and said PLL-DRO, and an isolator connected between the output of said PLL-DRO and the multiplier-output-frequency input of said mixer.

7. The phase-locked-loop as in claim 2, said reference generator further comprising (a) a crystal oscillator, providing said crystal-oscillator output; and, (b) a PLL, said PLL including
  (1) a phase detector, with first input from said crystal-oscillator output and second input from said voltage-controlled-crystal-oscillator output, and with a phase-detector output providing a phase-error signal;
  (2) a low-pass-filter, with input from said phase-detector output, and a low-pass-filtered phase-error signal output;
  (3) a modulation input, which accepts an input modulation signal;
  (4) a summing circuit, for combining said low-pass-filtered phase error signal and said input modulation signal, resulting in a voltage-controlled-oscillator control signal;
  (5) a voltage-controlled-oscillator, with voltage-controlled-oscillator control signal input from said summing circuit, said voltage-controlled-oscillator control signal serving to modulate said voltage-controlled-oscillator output frequency,
  said voltage-controlled-oscillator output serving as said voltage-controlled-crystal-oscillator output;
  thereby providing a modulated voltage-controlled-crystal-oscillator output correlated to said crystal-oscillator output.

8. A millimeter-wavelength synthesizer with frequency-shift-keyed modulation transmitter, comprising (a) a reference generator,
  (1) having a modulation input for accepting input modulation;
  (2) having an unmodulated carrier frequency "xo" output, at frequency $\Phi_r$; and,
  (3) having modulated frequency "vcxo" output, also with nominal carrier frequency $\Phi_r$, said modulated frequency output correlated to said unmodulated carrier frequency output;

(b) a divide-by-R frequency divider, for dividing said reference frequency, $\Phi_r$, by a factor, R, thereby providing output frequency, $\Phi_r/R$;

(c) a multiply-by-M frequency multiplier, for multiplying said reference frequency, $\Phi_r$, by a factor, M, thereby providing output frequency, $\Phi_M$;

(d) an n-mixer, for mixing the phase-locked-loop output frequency, $\Phi_O$, and said multiplier output frequency, $\Phi_M$, thereby proving a mixer output frequency;

(e) a divide-by-N frequency divider, for dividing said mixer output frequency by a factor, N, thereby providing output frequency, $\Phi'_o$;

(f) a phase detector, with phase-detection slope $K_d$,
having a first input, $\Phi_i$, for accepting input $\Phi_r/R$ from said divide-by-R divider output, and
having a second input, $\Phi'_o$, for accepting input from said divide-by-N frequency divider, and
providing a phase-detector output phase-error signal output depending on the phase difference between $\Phi_i$ and $\Phi'_o$,
said output phase error signal equal to the product $K_d$ times $(\Phi_i - \Phi'_o)$;

(g) a low-pass-filter, with transfer function $F_L(s)$,
for accepting said phase-error signal from said phase-detector output, as input to said low-pass-filter, and
for providing a low-pass-filtered phase-error signal output;

(h) a voltage-controlled oscillator, having transfer function $K_{VCO}/s$,
having a control-voltage input, for accepting said low-pass-filtered phase-error signal output, and
having an output for providing the phase-locked-loop output, with output frequency, $\Phi_O$.

9. The transmitter as in claim 8, wherein
(a) said multiplier comprises a phase-locked-dielectric-resonant-oscillator (PLL-DRO); and,
(b) said voltage-controlled-oscillator is a millimeter-wavelength output voltage-controlled-oscillator.

10. The transmitter as in claim 9, further comprising
(a) a band-pass filter connect between said reference generator and said PLL-DRO;
(b) an isolator connected from the output of said PLL-DRO to the multiplier-output frequency input of said mixer;
(c) an isolator connected between
   (1) the output of said millimeter-wavelength output voltage-controlled-oscillator, and
   (2) the input of a sampler;
(d) said sampler, having said input and sample and main outputs,
   (1) said sample output connected to the phase-locked-loop-output-frequency input of said mixer, and p2
   (2) said main output connected to a first terminal of a circulator,
(e) said circulator, also having second and third terminals, with
   (1) said second terminal connected to a terminator, and
   (2) said third terminal providing the transmitter output.

11. The transmitter as in claim 8, wherein
(a) said "xo" output of said reference generator is connected to the input of said multiplier; and,
(b) said "vcxo" output of said reference generator is connected to said divide-by-R frequency divider input.

12. A method for frequency-hopping frequency synthesis with FSK modulation by phase-locked frequency multiplication providing output frequency deviation independent of frequency-multiplication factor, comprising the steps of
(I) providing a phase-locked loop including
   (a) a reference generator,
      (1) having a modulation input for accepting input modulation; and,
      (2) having an unmodulated carrier frequency "vcxo" output, at frequency $\Phi_r$;
      (3) having modulated frequency "vcxo" output, also with nominal carrier frequency $\Phi_r$, said modulated frequency output correlated to said unmodulated carrier frequency output;

(b) a divide-by-R frequency divider, for dividing said reference frequency, $\Phi_r$, by a factor, R, thereby providing output frequency, $\Phi_r/R$;
(c) a multiply-by-M frequency multiplier, for multiplying said reference frequency, $\Phi_r$, by a factor, M, thereby providing output frequency, $\Phi_M$;
(d) an n-mixer, for mixing the phase-locked-loop output frequency, $\Phi_O$, and said multiplier output frequency, $\Phi_M$, thereby providing a mixer output frequency;
(e) a divide-by-N frequency divider, for dividing said mixer output frequency by a factor, N, thereby providing output frequency, $\Phi'_o$;
(f) a phase detector, with phase-detection slope $K_d$,
having a first input, $\Phi_i$, for accepting input $\Phi_r/R$ from said divide-by-R divider output, and
having a second input, $\Phi'_o$, for accepting input from said divide-by-N frequency divider, and
providing a phase-detector output phase-error signal output depending on the phase difference between $\Phi_i$ and $\Phi'_o$,
said output phase error signal equal to the product $K_d$ times $(\Phi_i - \Phi'_o)$;
(g) a low-pass-filter, with transfer function $F_L(s)$,
for accepting said phase-error signal from said phase-detector output, as input to said low-pass-filter, and
for providing a low-pass-filtered phase-error signal output;
(h) a voltage-controlled oscillator, having transfer function $K_{VCO}/s$,
having a control-voltage input, for accepting said low-pass-filtered phase-error signal output, and
having an output for providing the phase-locked-loop output, with output frequency, $\Phi_O$;

(II) calculating the values of n, M, R, and N, to achieve the desired frequency-multiplication ratio;
(III) programming at least one of the values of n, M, N, and R;

thereby effecting frequency-hopping synthesizer operation.

13. The method as in claim 12, wherein
(a) said unmodulated carrier frequency "xo" output, at frequency $\Phi_r$ serves as the input to said multiply-by-M frequency multiplier; and,
(b) said modulated frequency "vcxo" output, also with nominal carrier frequency $\Phi_r$, serves as the input to said divide-by-R frequency divider.

14. The method as in claim 13, wherein
(a) said unmodulated carrier frequency "xo" output, at frequency $\Phi_r$ serves as the input to said divide-by-R frequency divider; and,
(b) said modulated frequency "vcxo" output, also with nominal carrier frequency $\Phi_r$, serves as the input to said multiply-by-M frequency multiplier.

15. The method as in claim 12, wherein said multiplier comprises a phase-locked-dielectric-resonant-oscillator (PLL-DRO).

16. The transmitter as in claim 8, wherein
(a) said "vcxo" output of said reference generator is connected to the input of said multiplier; and,
(b) said "xo" output of said reference generator is connected to said divide-by-R frequency divider input.

* * * * *